(12) United States Patent
Valenti

(10) Patent No.: US 6,809,007 B2
(45) Date of Patent: Oct. 26, 2004

(54) METHOD AND A CARRIER FOR TREATING END FACETS IN PHOTONIC DEVICES

(75) Inventor: Paolo Valenti, Turin (IT)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/637,978

(22) Filed: Aug. 8, 2003

(65) Prior Publication Data

US 2004/0086645 A1 May 6, 2004

(30) Foreign Application Priority Data

Oct. 31, 2002 (EP) ............................................ 02257565

(51) Int. Cl.[7] ........................ H01L 21/30; H01L 21/46
(52) U.S. Cl. ...................................... 438/455; 438/460
(58) Field of Search ........................... 438/455, 33, 42, 438/68, 113, 456, 457, 458, 459, 460, 535, 576, 584, 905

(56) References Cited

U.S. PATENT DOCUMENTS

| | | | | |
|---|---|---|---|---|
| 5,154,333 A | * | 10/1992 | Bauer et al. ................... 225/1 |
| 5,177,031 A | * | 1/1993 | Buchmann et al. ............ 438/38 |
| 5,668,049 A | * | 9/1997 | Chakrabarti et al. ........... 438/33 |
| 5,911,830 A | * | 6/1999 | Chakrabarti et al. ......... 118/503 |
| 6,037,006 A | | 3/2000 | Chakrabarti et al. ......... 427/294 |
| 6,263,555 B1 | | 7/2001 | Freund et al. .............. 29/426.5 |

FOREIGN PATENT DOCUMENTS

| | | |
|---|---|---|
| JP | 11317565 | 11/1999 |
| JP | 2000133871 | 5/2000 |

* cited by examiner

*Primary Examiner*—David Nhu

(57) ABSTRACT

A carrier for treating photonic devices such as laser bars is provided with a recessed formation with a web surface for supporting the photonic device in contact therewith as well as at least one side surface forming an abutment surface for engaging a respective end facet of the photonic device. The photonic device is arranged in the recessed formation so that the lower surface of the photonic device is masked with respect to the treatment source, while at least one end facet of the photonic device engages at least one side surface by leaving exposed a surface to be treated. A protection member is placed in contact with the upper surface of the photonic device and the carrier with the photonic device arranged therein is exposed to the treatment source. The treatment is thus effective substantially exclusively on the surfaces of the end facets to be treated.

21 Claims, 3 Drawing Sheets

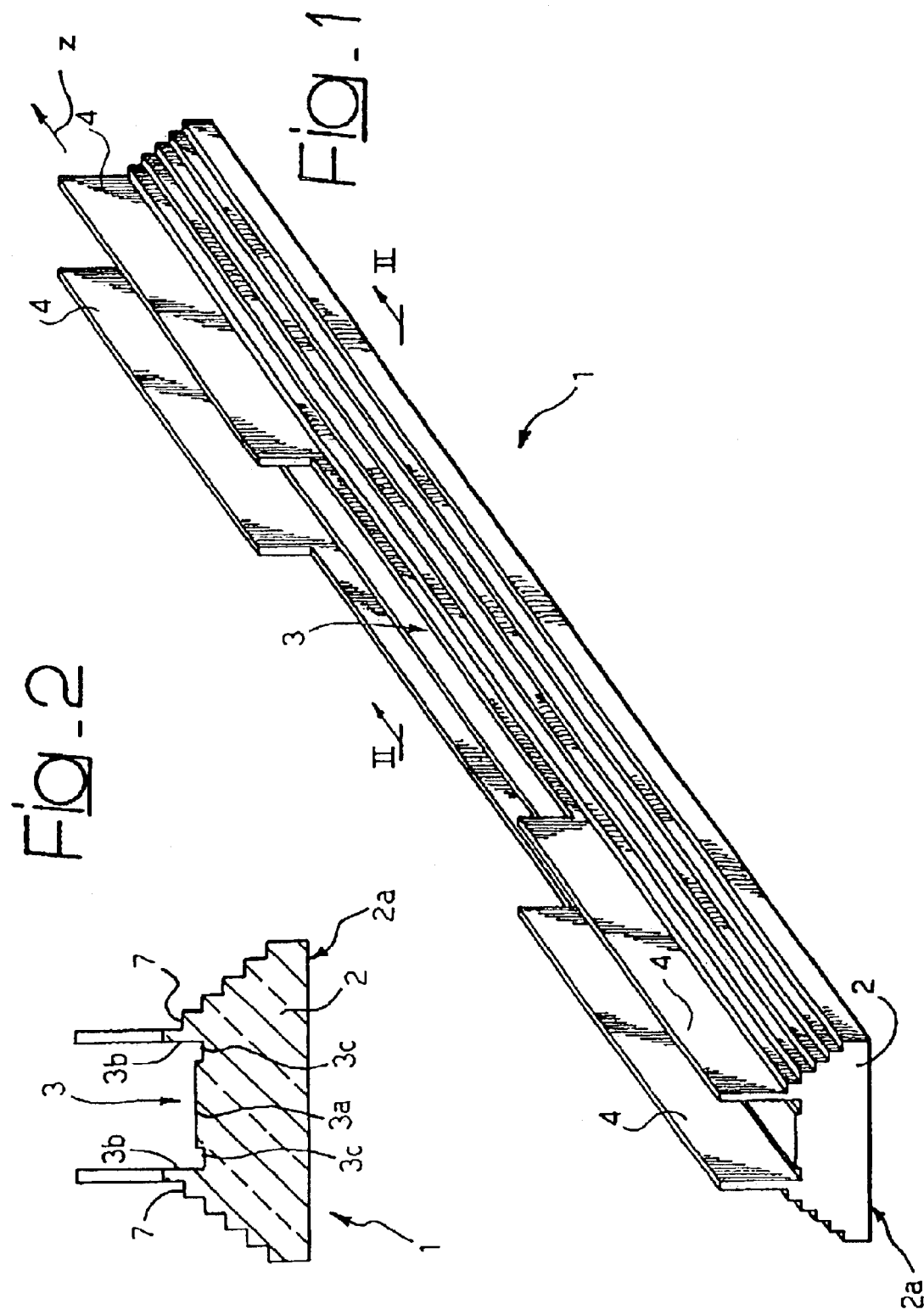

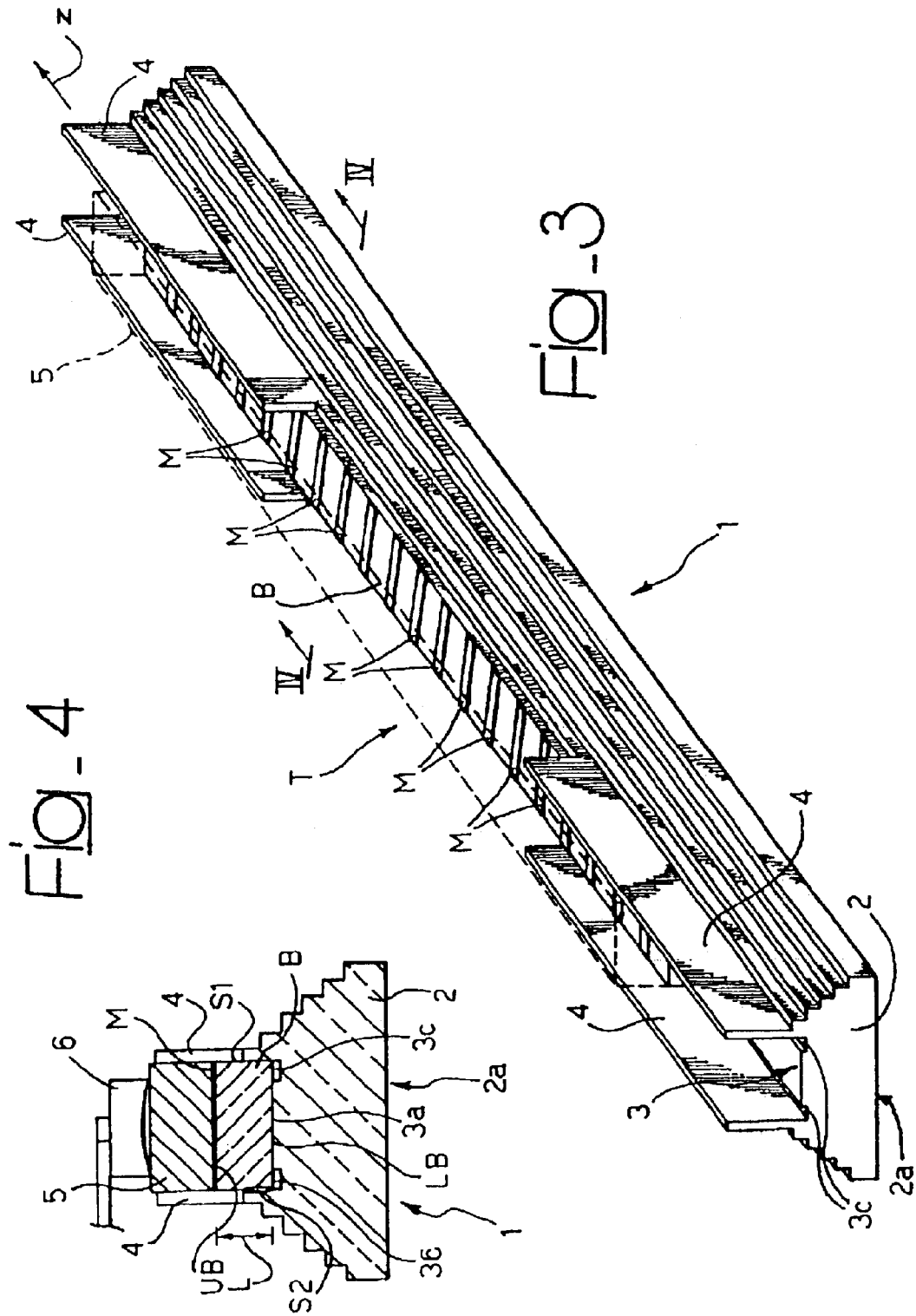

METHOD AND A CARRIER FOR TREATING END FACETS IN PHOTONIC DEVICES

FIELD OF THE INVENTION

The invention relates to photonic devices. As used herein, the designation "photonic device" is intended to apply to all kinds of devices whose operation involves photons. Exemplary of such devices are optoelectronic devices, integrated optics devices, optical waveguides, photonic integrated circuits, and the like. Also, the designation "photonic device" is intended to apply to any intermediate products obtained in the manufacture of such devices: exemplary of such intermediate products are so-called "laser bars" or "optical amplifier bars" from which individual semiconductor laser sources or amplifiers are produced by segmenting such bars.

More specifically, the invention deals with a technique for treating end facets in photonic devices.

DISCUSSION OF THE BACKGROUND

Photonic devices such as semiconductor lasers or semiconductor optical amplifiers may need coatings on their end facets in order permit proper operation. For instance, semiconductor lasers are produced from laser bars having opposed first and second major surfaces with similarly opposed end facets extending between and orthogonally to the major surfaces. Electrically conductive strips in the form of metalisations extending between the end facets of the laser bar are already provided at given distances on the first or upper major surface of the laser bar. Each such metalisation is intended to define a respective lasing cavity whose end mirrors are defined by the end facets.

Treatment of these end facets typically involves deposition of one or more coating layers having reflection-modifying properties. Coating is usually effected by resorting to e-gun deposition technology in a vacuum chamber. In the case of laser manufacturing, after such coating—and additional treatment(s) as possibly required—the laser bar is fragmented into a plurality of individual laser dice, each having a respective contact metalisation at its upper surface and intended to constitute an individual laser device.

All of the foregoing corresponds to standard technology and, as such, does not require to be described in greater detail herein.

The required treatment (e.g. coating) must be limited to the end facets. For instance, in the case of a laser bar, deposition of the coating material on the major surfaces of the laser bar is highly undesirable and must be avoided as this may adversely affect further manufacturing steps and, more generally, operation and reliability of the final product.

Obviously, no unwanted coating may take place on those surfaces eventually intended to represent the "lateral" faces of each individual laser (or amplifier) device produced from the bar: those lateral surfaces are in fact exposed only as a result of the bar (already coated at its end facets) being segmented into single devices.

Masking techniques are well known and might be resorted to in photonic device technology when a certain surface must be protected from undesired deposition/treatment. However, these known techniques are not truly attractive when considered for use in the scenario outlined in the foregoing: this is primarily due to the very small dimensions of the components to be treated, that make such components inherently difficult to handle. Also, some of these techniques may adversely affect the quality of the final product, e.g. by leading to unwanted contamination of the facets being treated.

"Mechanical" masking of those surfaces that must be excluded from the coating process may thus be preferred. This may occur by means of "dummy" bars or plates. Precise positioning of those masking bodies becomes however a quite critical factor. For instance, bars currently used for manufacturing semiconductor lasers for optical communications are in the form of rectangular bars having a width in the range of 300 microns or less and a height of 100 microns or less. Even very small misalignments in the masking arrangement may thus be detrimental to the result in the coating process as these may lead e.g. to unwanted "shadowing" and "overspray" phenomena. Also, mechanical masking techniques may require very delicate handling of the device or product being treated and/or may not be suitable to be automated, thus adversely affecting productivity of the coating process and manufacturing process at large.

SUMMARY OF THE INVENTION

The object of the present invention is thus to provide an improved solution that overcomes the drawbacks of prior art techniques outlined in the foregoing. According to the present invention, such an object is achieved by means of a method having the features set forth in the claims that follow. The invention also relates to a carrier for carrying out such a method.

BRIEF DESCRIPTION OF THE DRAWING

The invention will now be described, by way of non-limiting example only, by referring to the enclosed figures of drawing, wherein:

FIG. 1 is a general perspective view of a carrier for carrying out the method of the invention, FIG. 2 is a cross sectional view along line II—II, FIGS. 3 and 4 essentially correspond to the views of FIGS. 1 and 2, respectively, wherein a photonic device in the form of a laser bar to be treated is shown located in the carrier of FIGS. 1 and 2, and FIGS. 5 to 7 are additional views essentially corresponding to the view of FIG. 4 showing various steps in carrying out a method according to the invention.

DETAILED DESCRIPTION OF THE PREFERRED EMBODIMENT

Figure 5:
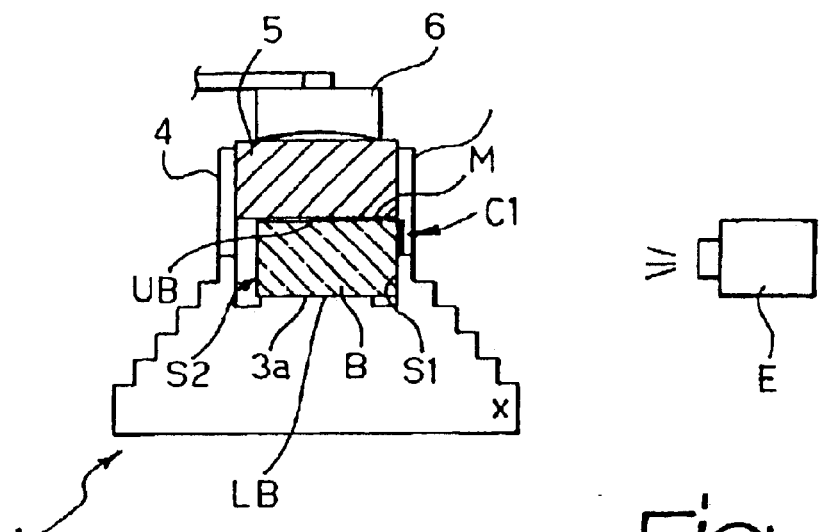

The detailed description provided in the following refers—by way of example—to the treatment of the end facets of a bar such as a laser bar or amplifier bar, that is bars intended to be eventually segmented to produce individual laser or optical amplifier devices. Those of skill in the art will promptly appreciate that the same arrangement and/or method can be applied to the treatment of a wide variety of photonic devices such as e.g. optoelectronic devices, integrated optics devices, optical waveguides, photonic integrated circuits and the like.

In the drawing, reference numeral 1 designates a carrier (i.e. a fixture or jig) adapted for use in treating the end facets of a photonic device such as a semiconductor laser bar B.

The carrier 1 preferably consists of a shaped body of a dimensionally stable material adapted to be machined with a high degree of precision. Silicon was found to be particularly adapted for that purpose, in view of the possibility of obtaining a shaped body having very clean edges. By "clean" edge an edge is meant defined by two highly planar surfaces, preferably defining a precise right (90 degree wide), angle therebetween. Silicon is adapted to be machined by using, for example, rotary cutting tools. Also, a silicon carrier can be periodically cleaned by dipping into a hydrofluoric acid bath to remove layers of material possibly formed thereon as a result of being exposed to a coating process. Other materials currently used in semiconductor device technology and integrated optics technology and exhibiting the same features may represent viable alternatives to silicon.

As better appreciated in the cross-sectional views of FIGS. 2 and 4, the carrier 1 is preferably comprised of a one-piece body including an enlarged base portion 2 of a generally tapered profile and including a channel-shaped recessed formation 3 at its narrow extremity. In the presently preferred embodiment, the base portion 2 includes a flat bottom surface 2a adapted for letting the carrier 1 rest on a flat support surface (not shown). Advantageously, the flat support surface in question may be in the form of a rotary platform adapted for rotating the carrier 1 over 180 degrees for reasons to be better explained in the following.

The tapered shape of the base portion 2 is preferably achieved in the form of a stepped, pyramid-like profile, so that the recessed channel-shaped formation 3 is located at the upper end of the base portion 2, opposite the bottom surface 2a. The cross-sectional profile just described was found to represent a preferred choice for conferring a high degree of rigidity and dimensional stability to the carrier 1 while ensuring that small tilting errors likely to arise when the carrier is positioned to carry out the coating process shall not adversely affect such a process.

The recessed formation 3 extends in a given direction generally designated z in FIGS. 1 and 3 and includes a web surface 3a as well as two side walls extending upwardly from the web surface 3a to form two side surfaces 3b in the channel-like formation 3. Such a channel-like formation including two symmetrical side surfaces 3b represents the presently preferred embodiment of the carrier 1. In alternative, presently less preferred embodiments of the invention, the recessed formation 3 may include asymmetrical side surfaces 3b or a single side surface 3b extending from the web surface 3a.

Still preferably, a groove 3c forming a sort of trench extending along the web surface 3a of the formation 3 is provided at the region(s) of the web surface 3a neighbouring the or each side surface 3b. As better appreciated in FIG. 4, the groove or grooves 3c ensure that when a photonic device such as a laser bar B is arranged in the recessed formation 3 to carry out a coating process as better described in the following, the laser bar B is not strictly confined into the recessed formation 3. Such a strict confinement may in fact expose the crystal structure of the bar B to the risk of damage.

At both ends of the carrier 1 along the z-axis, the side walls of the channel-like recessed formation 3 are provided with upward extensions 4. Such extensions cause the channel-like formation 3 to have higher side walls, that is a "deeper" profile, at both ends of the carrier 1. The recessed formation 3 can thus be regarded as a sub-divided in three sections along the z-axis, namely a first, central section T where the coating treatment is carried out as better explained in the following, plus two end portions where the extensions 4 act as a stabilising portions to held in place a "dummy" bar 5 intended to cooperate with the bar B during the coating process.

Figure 6:
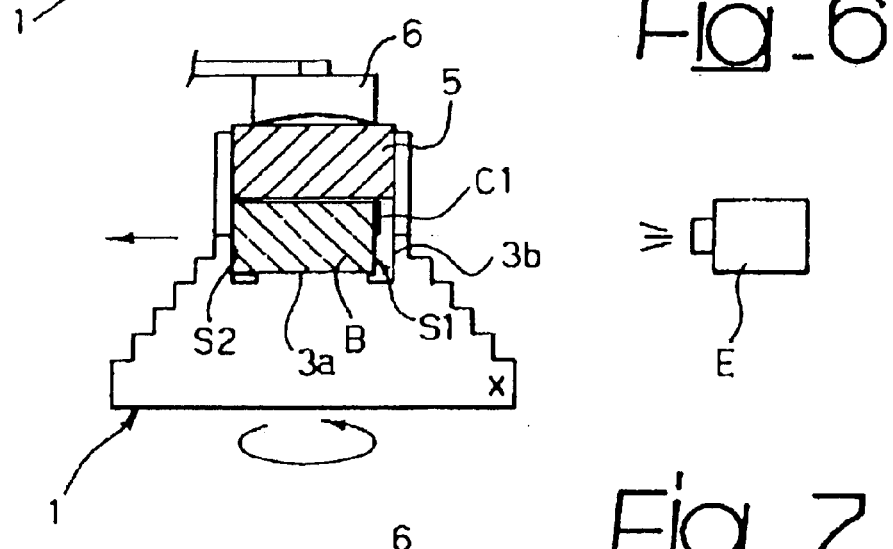
Figure 7:
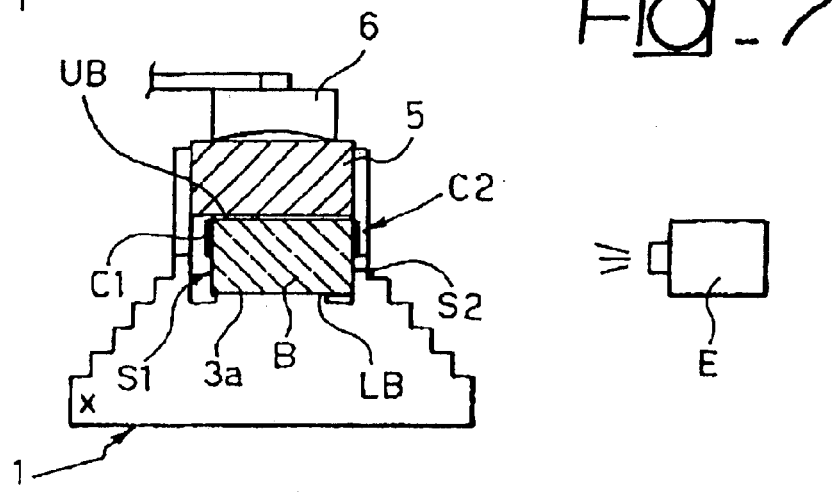

As indicated, the bar B is usually in the form of a parallelepiped bar having opposed first and second major surfaces designated UB and LB, respectively (see FIG. 4). Extending over a given height L orthogonally therebetween are two end facets designated S1 and S2, respectively. Adjacent the first major surface UB, each end facet S1, S2 has an upper portion that is to be subjected to a coating process. This is effected e.g. by depositing an anti-reflective coating by resorting to e-gun technology in a vacuum chamber. A suitable e-gun coating source (of a known type), generally designated E, is shown in FIGS. 5 to 7. The details of such a coating process, and the process or processes to which the end facets S1 and S2 are to be exposed are generally known in the art and will not be further described in the following.

During the coating process, the bar B is located in the recessed formation 3 provided in the carrier 1 by causing the second major surface (i.e. the "bottom" surface LB) of the bar B to rest on the web surface 3a while the end facets S1 and S2 abut against the side surfaces 3b. The extent these side surfaces 3b extend upwardly with respect to the web surface 3a is determined by taking into account the net height L of the end facets S1 and S2 of the laser bar B to be treated. Specifically, the extent the side surfaces 3b extend upwardly with respect to the web surface 3a is selected in such a way that the upper surface UB carrying the regularly spaced metalisations M as well as the upper portions of the end facets S1 and S2 immediately adjacent thereto are left exposed over the central treatment portion T of the carrier 1 (see, for instance, FIG. 3).

The remaining (bottom) portion of the end facets S1, S2 as well as the lower surface LB of the laser bar B are securely masked as a result of abutting against the side surfaces 3b and resting on the bottom surface 3a of the formation 3. A "dummy" bar such as the bar 5 can then be arranged in the carrier 1 by positioning the dummy bar 5 onto the upper surface UB of the bar B as better shown in FIG. 4. The dummy bar 5 being put in place ensures that the bar B is precisely and securely retained in the recessed formation 3 without any risk of being accidentally displaced. Preferably, the dummy bar 5 has associated an elastic member such as a leaf spring 6 (of a known type) that urges the dummy bar 5 towards the web surface 3a, that is towards the bar B. In FIG. 3, the outline of the dummy bar 5 is shown in dashed lines in order to avoid undesirably masking the underlying portions of the figure. It will be appreciated however that the upwardly extending portions 4 act as register elements ensuring that the dummy bar 5, and thus the bar B, are correctly positioned and retained in carrier 1. As shown, such register elements are provided at both ends of the carrier 1 and are arranged to act at both sides of the dummy bar 5.

In addition to ensuring that the bar B is securely retained in the carrier 1, the dummy bar 5 also acts as a masking formation extending over the upper surface UB of the laser bar B. The upper surface UB is therefore precisely and completely masked with respect to the coating process.

The role of the dummy bar 5 may be equally played by another bar essentially identical to the bar B shown in the drawings. The arrangement shown in the drawings may therefore be extended to coating e.g. the end facets of a plurality of laser or optical amplifier bars superposed in a stack in the carrier 1. In such an arrangement, each bar in the stack has its lower or bottom surface LB masked out from the coating process as a result of such lower surface being in close contact with the upper surface of the bar located immediately below in the stack. Similarly, the upper surface of each bar within the stack is masked out from the coating process as a result of being in close contact with the lower surface of the bar located immediately there above in the stack.

For those bars not located within the stack, that is the two bars arranged at the lowermost and the uppermost positions in the stack, respectively, masking of the lower surface (in the case of the lowermost bar) and the upper surface (in the case of the uppermost laser bar) may be ensured by the lower surface in the lowermost bar resting onto the web portion 3a of the recessed formation 3 and by the upper surface in the uppermost bar being masked by a dummy bar such as dummy bar 5 placed over the top of the stack of bars being treated simultaneously.

Stacks including, say, twenty superposed bars B may thus be arranged in a carrier as shown in the drawing without risk of twisting or buckling. Obviously, in the case of stack coating of bars the upward extensions 4 must be suitably modified (that is further extended upwardly) in order to enable them to securely guide and retain the sides of the stack thus formed in the carrier 1.

FIGS. 3 and 4 described in the foregoing refer to an arrangement where the "width" of the bar B, that is the distance between the end facets S1 and S2, is substantially identical (in fact slightly smaller) than the width of the recessed formation 3, so that once the bar B is located in the carrier 1, both end facets S1, S2 abut against the side surfaces 3b of the recessed formation 3. Such an arrangement corresponds to a situation where a specific carrier 1 is made available for coating a corresponding type of bar B having a given width.

FIGS. 5 to 7 demonstrate that this is not a mandatory requirement in that a carrier such as the carrier 1 shown in the drawing is adapted for use in coating the end facets of bars (and photonic devices in general) of different widths. This provided, of course, that the device in question has a width smaller than the width of the recessed formation 3, thereby enabling the device to be correctly located in the recessed formation of carrier 1. This fact is related to coating processes such as e-gun coating being primarily intended to coat surfaces that are exposed to the e-gun generator.

FIG. 5 thus shows a first coating layer C1 being formed over the end facet S1 as a result of such end facet being exposed to the e-gun source E while both the upper surface UB and the lower surface LB are masked out from the coating process by the dummy bar 5 and the bottom surface 3a, respectively. More precisely, the coating C1 is formed only at the upper portion of the end facet S1, namely that portion adjacent to the metalisation M where operation as a lasing cavity will take place during laser operation.

Once coating C1 is formed, the whole of the carrier 1 having the bar B located therein can be rotated over 180 degrees to expose the other end facet, namely facet S2, to the e-gun source E as depicted in FIG. 7. In that way another coating C2 is formed over the end facet S2 in the vicinity of the upper surface UB.

FIG. 6 is intended to highlight that, if the laser bar B is narrower than the channel-like formation 3, before or after turning over 180 degrees the carrier 1, the bar B is caused to be displaced laterally i.e. sidewise in the recessed formation 3 in order to move the end facet S1 (already coated at C1) away from the respective side surface 3b of the formation 3. Such a lateral displacement causes the opposed end facet S2 (yet to be coated) to abut against the opposite side surface 3b of the formation 3. The described lateral movement of the bar B in the recessed formation 3 generally requires the dummy bar 5 and the associated bias element 6 to be temporarily removed. To advantage, the lateral movement in question can be effectively obtained simply as a result of gravity by slightly tilting laterally the carrier 1 with the bar B located therein, so that the laser bar B "slides" across the recessed formation 3.

Quite obviously, in the case of the arrangement shown in FIG. 4 (i.e. the bar B and the recessed formation 3 having substantially the same width) the carrier 1 needs simply to be rotated over 180 degrees to expose the end face S2 to the e-gun source E without any lateral displacement of the laser bar B.

A result substantially identical to that shown by the sequence of FIGS. 5 and 7 might be obtained by displacing the e-gun source with respect to the carrier 1. Rotating the carrier 1 and the laser bar B located therein over 180 degrees is however largely to be preferred as this can be achieved very simply, e. g. by arranging the carrier 1 over a rotary table or platform arranged in the vacuum chamber where the e-gun source is located.

In that way, correct positioning of the bar B with respect to the e-gun source can be achieved with a high degree of accuracy. This also ensures that no appreciable tilting errors arise causing either of the end facets S1 or S2 to move away from the preferred orientation during coating i.e. substantially orthogonal to the direction leading from the end facet to the e-gun source E. The stepped profile of the base portion 2 of the carrier 1 provides for very small side surfaces 7 (see FIG. 2) being present at the footsteps of the side walls of the formation 3. This, in addition to these side walls being in turn very thin, further avoids any undesired "masking" effect of the e-gun beam being induced by such possible tilting errors.

Of course, the underlying principle of the invention remaining the same, the details and the embodiments may vary, also significantly, with respect to what has been described and shown just by way of example, without departing from the scope of the present invention as defined by the claims that follow.

What is claimed is:

1. A method for treating photonic devices having apposed first and second major surface with at least one end facet extending therebetween, said at least one end facet to be at least partly exposed to a treatment source while said major surface are to be masked with respect to said treatment source, the method comprising:

providing a carrier having a recessed formation with a web surface for supporting one said photonic device with said second major surface in contact therewith as well as at least one side surface forming an abutment surface for engaging said at least one end facet of the photonic device;

arranging said photonic device in said recessed formation of said carrier by letting said second major surface of the photonic device contact said web surface being thus masked with respect to said treatment source by said web surface in contact therewith, while said at least one end facet of the photonic device engages said at least one side surface while leaving exposed a surface of said at least one end facet to be treated;

placing a protection member in contact with said first major surface of the photonic device arranged in said recessed formation of said carrier, whereby said first major surface is masked with respect to said treatment source by said protection member; and exposing said carrier with said photonic device arranged therein to said treatment source, whereby said treatment is effective substantially exclusively on said surface of said end facet to be treated.

2. The method of claim 1, wherein said recessed formation is a channel-like formation having two opposed side surfaces, each of said side surface being adapted for forming an abutment surface for engaging a respective end facet of said photonic device.

3. The method of claim 1, wherein said exposing step comprises:
   a first exposure, wherein a first end facet of said photonic device to be treated is exposed to said treatment source to form a first treated surface,
   a re-positioning step, wherein said carrier with said photonic device arranged therein and said treatment source are moved with respect to each other to expose a second end facet of said photonic device to said treatment source, and
   a second exposure, wherein said second end facet to be treated is exposed to said treatment source to form a second treated surface.

4. The method of claim 3, wherein said re-positioning step involves rotating said carrier with said photonic device arranged therein over 180 degrees with respect to said treatment source.

5. The method of claim 2, wherein said exposing step comprises:
   a first exposure wherein a first end facet of said photonic device to be treated is exposed to said treatment source to form a first treated surface,
   a re-positioning step, wherein said carrier with said photonic device arranged therein and said treatment source are moved with respect to each other to expose a second end facet of said photonic device to said treatment source, and
   a second exposure, wherein said second end facet to be treated is exposed to said treatment source to form second treated surface;
   said method for treating a photonic device having a pair of opposed end facet having a distance therebetween, wherein:
   said recessed formation is formed with said opposite side surfaces forming a width of said channel-like formation over that is larger than said distance between said opposed end facets of the photonic device,
   during said first exposure said first end facet is kept abutting against a first one of said side surfaces, and
   said re-positioning step involves displacing said photonic device laterally within said recessed formation, causing said second end facet to abut against the other of said side surfaces of said channel-like recessed formation.

6. The method of claim 1, further comprising: arranging at least two photonic devices superposed in a stack in said carrier, the first major surface of an underlying photonic device in the stack being masked with respect to said treatment source by the second major surface of another photonic device superposed thereto in the stack, wherein the second major surface of said superposed photonic device in the stack is masked with respect to said treatment source by the first major surface of said underlying photonic device in the stack.

7. The method of claims 1, further comprising: selecting said photonic device as a bar for producing a plurality of individual devices and in that, after said treatment effective substantially exclusively on said surface of said end facet to be treated, said bar is segmented to produce a plurality of individual device, said individual devices produced from the bar having lateral surfaces that are exposed only as a result of the bar being segmented.

8. The method of claims 1, further comprising: selecting a said treatment source as a coating source.

9. The method of claim 1, further comprising: selecting said treatment source as an e-gun treatment source.

10. A carrier for carrying out a method for treating photonic devices having opposed first and second major surfaces with at least one end facet extending therebetween, said at least one end facet to be at least partly exposed to a treatment source while said major surfaces are to be masked with respect to said treatment source, the method comprising: providing a carrier having a recessed formation with a web surface for supporting one said photonic device with said second major surface in contact therewith as well as at least one side surface forming an abutment surface for engaging said at least one end facet of the photonic device; arranging said photonic device in said recessed formation of said carrier by letting said second major surface of the photonic device contact said web surface being thus masked with respect to said treatment source by said web surface in contact therewith, while said at least one end facet of the photonic devices engages said at least one side surface while leaving exposed a surface of said at least one end facet to be treated; placing a protection member in contact with said first major surface of the photonic device arranged in said recessed formation of said carrier, whereby said first major surface is masked with respect to said treatment source by said protection member; and exposing said carrier with said photonic device arranged therein to said treatment source, whereby said treatment is effective substantially exclusively on said surface of said end facet to be treated;
wherein said carrier includes a shaped body including a recessed formation having a web surface for supporting a photonic device with said second major surface in contact therewith as well as at least one side surface forming an abutment surface for engaging said at least one end facet of said photonic device, the carrier being adapted to have associated therewith a protection member to mask the first major surface of said photonic device with respect to said treatment source.

11. The carrier of claim 10, wherein said shaped body includes at least one positioning formation for positioning said protection member in contact with said first major surface of the photonic device.

12. The carrier of claim 11, wherein said at least one positioning formation is an extension of said at least one side surface of said recessed formation.

13. The carrier of claim 11, wherein said the recessed formation extends in a given direction and includes an intermediate portion for exposing said of least one end facet of said photonic device to said treatment source, and in that it includes at least two of said positioning formations arranged at opposite sides of said intermediate treatment region.

14. The carrier of claim 11, wherein said shaped body includes a channel-like recessed formation having opposite side surfaces and in that it includes at least two of said positioning formations forming respective extensions of the side surfaces of said channel-like recessed formation.

15. The carrier of claim 10, wherein said recessed formation includes at least one groove extending along said web surface between said web surface and said at least one side surface.

16. The carrier of claim 10, wherein said shaped body includes a base portion having a flat surface generally opposed said recessed formation.

17. The carrier of claim 10, wherein said shaped body includes a base portion with a generally tapered profile towards said recessed formation.

18. The carrier of claim 17, wherein said tapered profile is a stepped profile.

19. The carrier of claim 10, wherein said protection member is in the form of a bar member.

20. The carrier of claim 10, wherein said protection member has an associated bias member to urge said protection member in contact with said photonic device.

21. The carrier of claim 10, wherein said shaped body is comprised of silicon.

* * * * *